United States Patent
Hirano

(10) Patent No.: US 7,276,985 B2
(45) Date of Patent: Oct. 2, 2007

(54) TRANSMISSION MODULATION APPARATUS, COMMUNICATION APPARATUS AND MOBILE WIRELESS APPARATUS

(75) Inventor: Shunsuke Hirano, Totsuka-ku (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 29 days.

(21) Appl. No.: 11/352,244

(22) Filed: Feb. 13, 2006

(65) Prior Publication Data

US 2006/0202774 A1    Sep. 14, 2006

(30) Foreign Application Priority Data

Feb. 14, 2005   (JP) ............................ 2005-036089

(51) Int. Cl.
*H04L 27/36*   (2006.01)
*H03C 3/08*   (2006.01)
*H03C 3/40*   (2006.01)

(52) U.S. Cl. ..................... 332/128; 332/145; 332/151

(58) Field of Classification Search .............. 332/128, 332/145, 151, 144; 331/23; 455/108, 102; 375/300, 376

See application file for complete search history.

(56) References Cited

U.S. PATENT DOCUMENTS

| | | | |
|---|---|---|---|
| 6,043,707 A * | 3/2000 | Budnik | 330/10 |
| 6,633,199 B2 * | 10/2003 | Nielsen et al. | 330/129 |
| 6,813,319 B1 * | 11/2004 | Nagle et al. | 375/302 |
| 7,129,778 B2 * | 10/2006 | Robinson | 330/151 |
| 7,212,791 B2 * | 5/2007 | Arayashiki | 455/91 |
| 2002/0141510 A1 * | 10/2002 | Sridharan et al. | 375/300 |
| 2004/0081260 A1 | 4/2004 | Matsusaka | |
| 2004/0213144 A1 | 10/2004 | Murakami et al. | |
| 2006/0009169 A1 * | 1/2006 | Arayashiki | 455/108 |
| 2006/0234652 A1 * | 10/2006 | Oka | 455/102 |

OTHER PUBLICATIONS

Peng et al., "A Novel EER Transmitter Using Two-Point Delta-Sigma Modulation Scheme for WLAN and 3G Applications," IEEE MTT-S (2002), pp. 1651-1654.

* cited by examiner

*Primary Examiner*—Joseph Chang
(74) *Attorney, Agent, or Firm*—Greenblum & Bernstein, P.L.C.

(57) ABSTRACT

Provided is a transmission modulation apparatus, using polar modulation of two-point modulation scheme, capable of completing a timing adjustment of a BB phase modulation signal and BB amplitude modulation signal in a short time. A phase modulation section (10) that performs two-point modulation with a PLL circuit is provided with a switch (17) to make the PLL circuit open loop, and when a first delay section (5) corrects the deviation in synchronization between the BB phase modulation signal and BB amplitude modulation signal, the switch (17) is turned off to make the PLL circuit open loop.

8 Claims, 8 Drawing Sheets

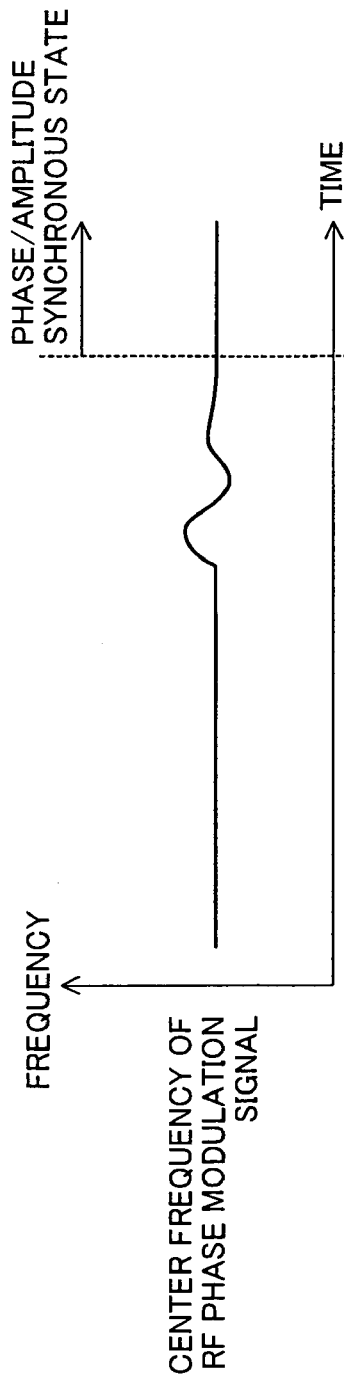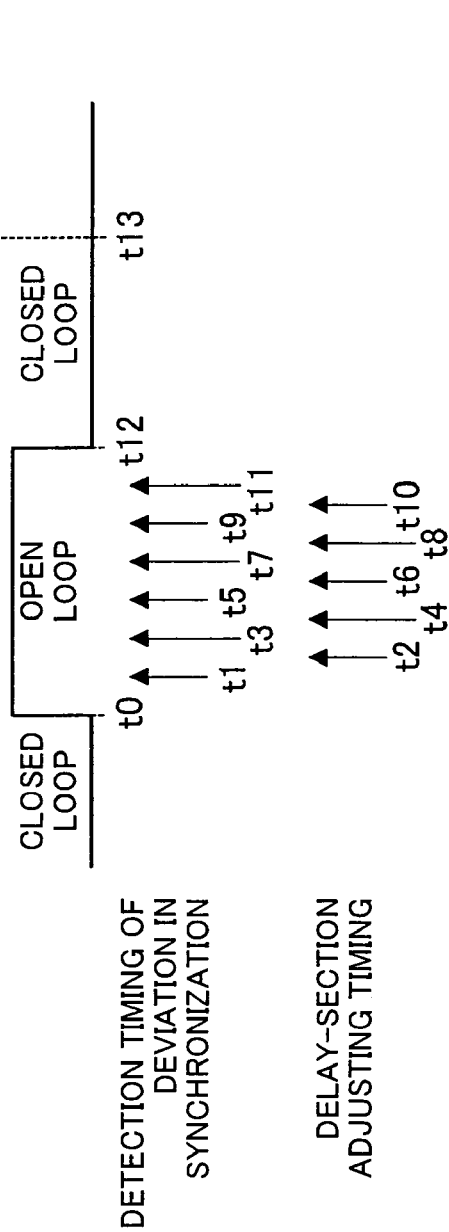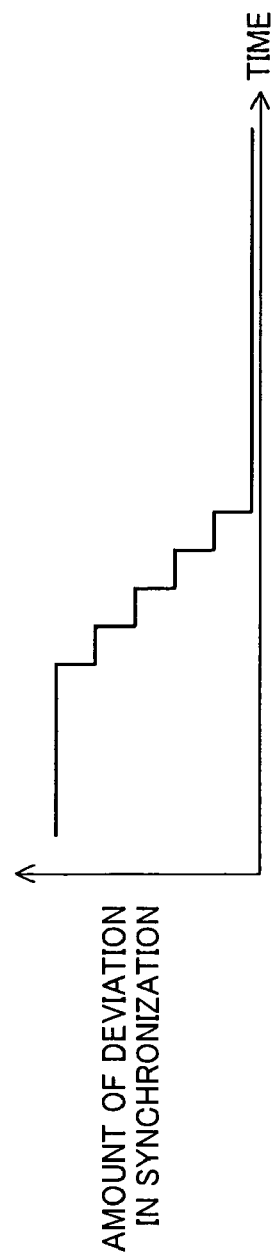
FIG.5A FIG.5B FIG.5C FIG.5D FIG.5E

TRANSMISSION MODULATION APPARATUS, COMMUNICATION APPARATUS AND MOBILE WIRELESS APPARATUS

BACKGROUND OF THE INVENTION

1. Field of the Invention

The present invention particularly relates to a transmission modulation apparatus that performs two-point modulation using a PLL (Phase Locked Loop) circuit and thereby generates a RF phase modulation signal, while combines the RF phase modulation signal and an amplitude modulation signal using a high-efficient linear transmission modulator and thereby performs polar modulation, and also relates to a communication apparatus and a mobile wireless apparatus provided with the transmission modulation apparatus.

2. Description of the Related Art

Generally, when a linear transmission modulator is designed, it is necessary to consider a trade-off between efficiency and linearity. Recently, however, technique has been proposed for obtaining both high efficiency and linearity in a linear transmission modulator by using polar modulation for separating an input signal into a phase component and amplitude component, and performing modulation and combining of the phase modulation signal and amplitude modulation signal using a signal of the amplitude component as power supply of a phase modulation amplifier (for example, see "A novel EER transmitter using two-point delta-sigma modulation scheme for WLAN and 3G applications", IEEE MTT-S 2002 (hereinafter, referred to as Non-patent Document 1).

FIG. 1 is a block diagram illustrating a configuration of a transmission modulation apparatus using conventional polar modulation associated with Non-patent Document 1. In other words, FIG. 1 shows an example of a circuit of the transmission modulation apparatus that performs polar modulation by two-point modulation scheme in a PLL circuit. As shown in FIG. 1, the transmission modulation apparatus is comprised of phase modulation section 100, modulation signal generation section 111 and amplitude modulation section 115a. When a transmission signal is input to modulation signal generation section 111, the signal is separated into a baseband (hereinafter, abbreviated as BB) phase modulation signal and BB amplitude modulation signal. Then, the BB phase modulation signal and BB amplitude modulation signal output from modulation signal generation section 111 are respectively input to phase modulation section 100 and amplitude modulation section 115a. Based on the BB phase modulation signal, phase modulation section 100 phase-modulates a carrier frequency and outputs a RF phase modulation signal. Based on the BB amplitude modulation signal, amplitude modulation section 115a amplitude-modulates the input RF phase modulation signal and outputs a RF modulation signal.

Phase modulation section 100 in FIG. 1 has a configuration of a PLL circuit of two-point modulation scheme to implement wideband phase modulation. In other words, phase modulation section 100 is provided with a PLL circuit comprised of VCO (Voltage controlled Oscillator) 101 that varies the oscillation frequency corresponding to the voltage of a control voltage terminal, frequency divider 102 that divides the frequency of a RF phase modulation signal output from VCO 101, phase comparator 103 that compares phase of an output signal of frequency divider 102 with a phase of a reference signal and outputs a signal corresponding to a phase difference, and loop filter 104 that averages output signals of phase comparator 103, delta-sigma modulator 106 that performs delta-sigma modulation on a BB phase modulation signal to output a dividing ratio to frequency divider 102, D/A converter 107 that converts the BB phase modulation signal into an analog voltage, and filter 108 which suppresses a high-frequency component occurring in D/A converter 107 and outputs a signal to the control voltage terminal of VCO 101.

Here, assuming G(s) as a transfer function of the PLL circuit comprised of VCO 101, frequency divider 102, phase comparator 103, and loop filter 104, BB phase modulation signal φa(s) input to the PLL circuit from A point is multiplied by G(s) that is the transfer function of a low-pass filter. In addition, BB phase modulation signal φb(s) input to the PLL circuit from B point is multiplied by 1−G(s) that is the transfer function of a high-pass filter, where s=jω.

The BB phase modulation signal φ(s) input to the PLL circuit from A point and BB phase modulation signal φ(s) input to the PLL circuit from B point are added at the control voltage terminal of VCO 101, and following equation (1) holds.

$$\phi(s) \cdot G(s) + \phi(s) \cdot [1-G(s)] = \phi(s) \quad (1)$$

In other words, the item of transfer function G(s) is canceled, and VCO 101 outputs a RF phase modulation signal unrelated to the transfer function of the PLL circuit. Thus, in the PLL circuit using the two-point modulation scheme, due to low-pass characteristics of the PLL circuit, a BB phase modulation signal is converted into the RF phase modulation signal without undergoing band limitation. By thus performing two-point modulation to generate a RF phase modulation signal, it is possible to implement wideband phase modulation.

The RF phase modulation signal thus generated in phase modulation section 110 is subjected to amplitude modulation in amplitude modulation section 115a. At this point, the BB amplitude modulation signal is multiplexed on the power supply terminal of power amplifier 114 by power control section 113. By this means, power amplifier 114 in amplitude modulation section 115a generates a RF modulation signal including an envelop variation.

Power amplifier 114 of amplitude modulation section 115a operates on the RF phase modulation signal in nonlinear mode (switching mode), while operating on the BB phase modulation signal multiplexed on the power supply terminal in linear mode. Generally, power amplifier 114 operating on a RF input signal in nonlinear mode (switching mode) is high efficient as compared with a power amplifier operating on a RF input signal in linear mode. In the case of thus using polar modulation, the transmitter of linear modulation is capable of using power amplifier 114 that operates in high efficient switching mode, and thereby it is possible to implement a high-efficient linear transmitter.

However, since the BB phase modulation signal and BB amplitude modulation signal separated and output in/from modulation signal generation section 111 are combined again in power amplifier 114, unless the RF phase modulation signal from VCO 101 and BB amplitude modulation signal from modulation signal generation section 111 are input to power amplifier 114 in amplitude modulation section 115a at appropriate timing, there is a possibility of deteriorating performance such as distortion of the spectrum of the RF modulation signal and the like.

Further, in the case of adjusting the timing for inputting the RF phase modulation signal and BB amplitude modulation signal to power amplifier 114, since the communication time is reduced by the adjustment time, it is desired that the time taken for the adjustment is as short as possible.

SUMMARY OF THE INVENTION

It is an object of the present invention to provide a transmission modulation apparatus using polar modulation of two-point modulation scheme enabling timing adjustments of a BB phase modulation signal and BB amplitude modulation signal to be completed in a short time.

A transmission modulation apparatus of the present invention is a transmission modulation apparatus which performs polar modulation by combining a RF phase modulation signal generated by performing two-point modulation using a PLL circuit and an amplitude modulation signal and transmits a modulated signal, and adopts a configuration provided with a delay section that adjusts timing for inputting a baseband phase modulation signal to the PLL circuit, and a high-impedance section that makes the PLL circuit equivalently open loop.

Further, a transmission modulation apparatus of the invention is a transmission modulation apparatus provided with a phase modulation section that generates a RF phase modulation signal based on a baseband phase modulation signal extracted from a transmission signal, and an amplitude modulation section that combines the RF phase modulation signal and a baseband amplitude modulation signal extracted from the transmission signal, performs polar modulation and transmits a modulated signal, where the phase modulation section performs two-point modulation based on the baseband phase modulation signal, and has a configuration provided with a PLL circuit that generates the RF phase modulation signal, a delay section that adjusts timing for inputting the baseband phase modulation phase signal to the PLL circuit, and a high-impedance section that makes the PLL circuit equivalently open loop.

According to such a configuration, correction of deviation in synchronization between the baseband amplitude modulation signal and RF phase modulation signal can be implemented by the delay section correcting a delay amount of the baseband phase signal. Further, since the high-impedance section is provided that makes the PLL equivalently open loop, only when the delay section acquires synchronization between the baseband amplitude modulation signal and RF phase modulation signal, it is possible to make the PLL circuit equivalently open loop by operating the high-impedance section. By this means, the center frequency of the RF phase modulation signal does not shift when the PLL circuit is an open loop, and it is thereby possible to correct a delay amount of the phase modulation signal in an extremely short time and acquire synchronization between the baseband amplitude modulation signal and RF phase modulation signal. In other words, when the delay section makes a delay adjustment to the baseband phase modulation signal while keeping the PLL circuit closed loop, the center frequency of the RF phase modulation signal varies whenever the adjustment is made, and it takes a long time to converge the deviation in synchronization between the baseband amplitude modulation signal and RF phase modulation signal. According to the above-mentioned configuration, it is possible to avoid such a delay effectively.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 3A is a chart showing a center frequency of the RF phase modulation signal, FIG. 3B shows timing for detecting a deviation in synchronization, FIG. 3C shows adjustment timing by a delay section, and FIG. 3D is a chart showing an amount of deviation in synchronization;

FIG. 5 contains a timing chart until synchronization between the RF phase modulation signal and BB amplitude modulation signal is acquired in the transmission modulation apparatus as shown in FIG. 4, where FIG. 5A is a chart showing a center frequency of the RF phase modulation signal, FIG. 5B shows timing for making an open loop, FIG. 5C shows timing for detecting a deviation in synchronization, FIG. 5D shows adjustment timing by a delay section, and FIG. 5E is a chart showing an amount of deviation in synchronization;

DETAILED DESCRIPTION OF THE PREFERRED EMBODIMENT

Summary of the Invention

Figure 2:
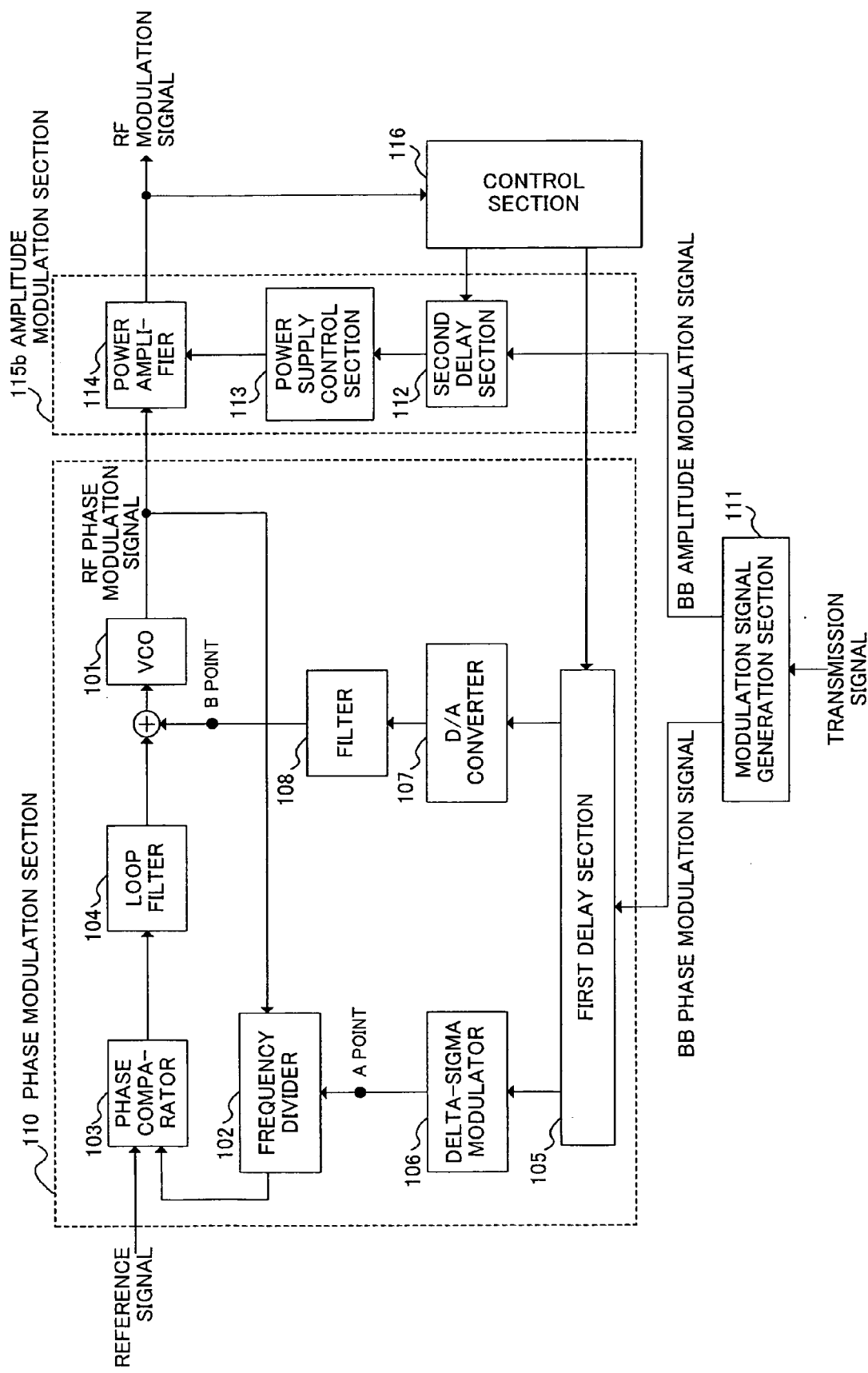
FIG. 2 is a block diagram illustrating a configuration of a transmission modulation apparatus to input a RF phase modulation and BB amplitude modulation signal to a power amplifier at appropriate timing.

The inventor of the present invention first considered a configuration as shown in FIG. 2 as a configuration to input a RF phase modulation and BB amplitude modulation signal to a power amplifier at an appropriate timing in a transmission modulation apparatus using polar modulation.

Figure 1:
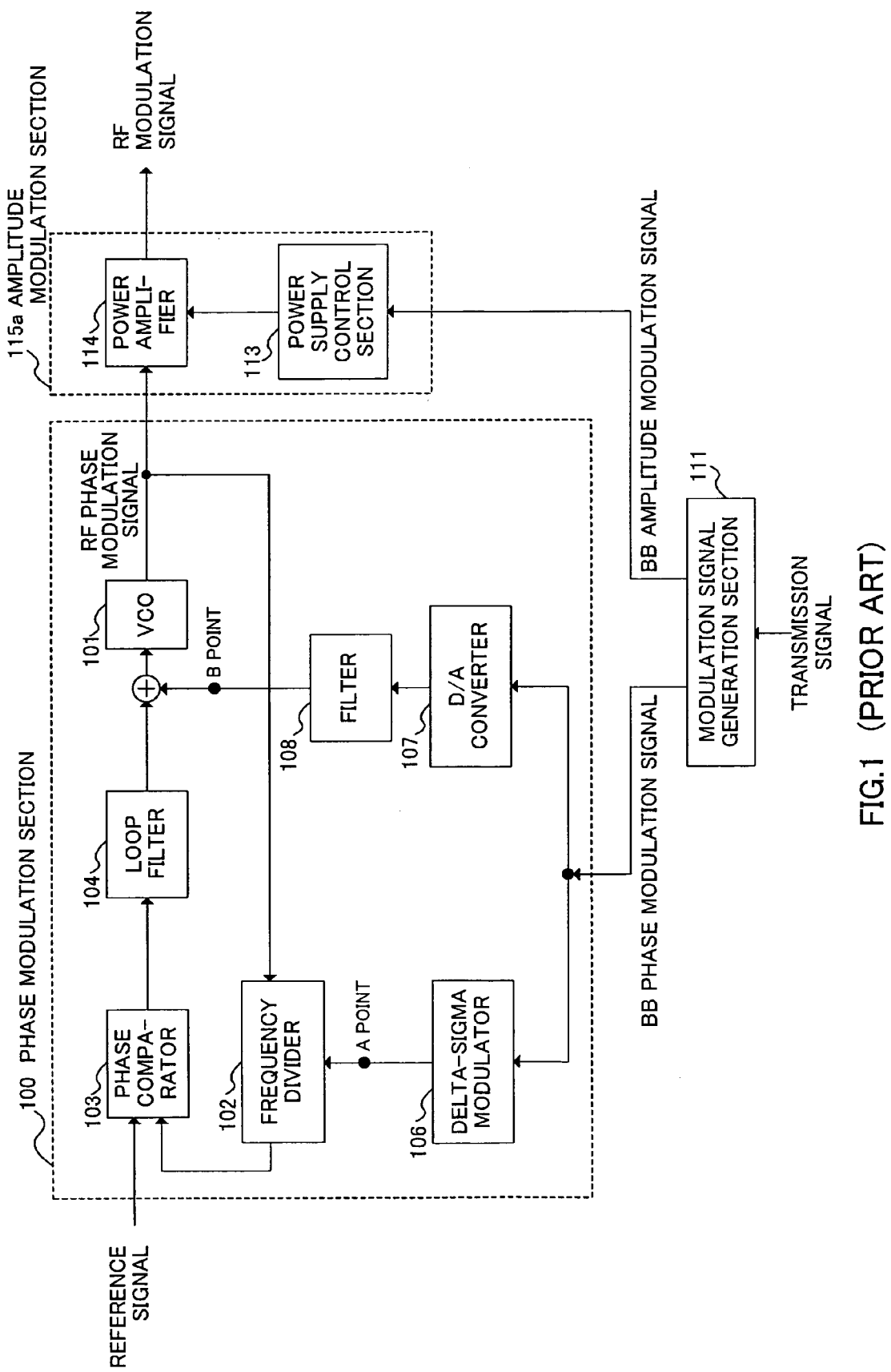
FIG. 1 is a block diagram illustrating a configuration of a transmission modulation apparatus in conventional polar modulation.

In FIG. 2 with same sections as in FIG. 1 assigned the same reference numerals, the transmission modulation apparatus has a configuration of the transmission modulation apparatus as shown in FIG. 1 further provided with first delay section 105 that delays a BB phase modulation signal and outputs the delaed BB phase modulation signal to delta-sigma modulator 106 and D/A converter 107, second delay section 112 that delays a BB amplitude modulation signal and outputs the delayed BB amplitude signal to power supply control section 113, and control section 116 that transmits a control signal and controls delay amounts in first delay section 105 and second delay section 112 corresponding to an output state of a RF modulation signal output from VCO 101 in phase modulation section 110. Accordingly, configurations of phase modulation section 100 and amplitude modulation section 115*a* as shown in FIG. 1 are different those in FIG. 2, and therefore, FIG. 2 shows phase modulation section 110 and amplitude modulation section 115b with reference numerals changed.

By the configuration of the transmission modulation apparatus as shown in FIG. 2, delta-sigma modulator 106 is capable of performing delta-sigma modulation on an output signal of first delay section 105 and outputs the output signal to frequency divider 102 as a dividing ratio, and D/A converter 107 is capable of converting another output signal of first delay section 105 into an analog voltage and outputs the output signal to filter 108. Then, by control 116 controlling first delay section 105 and second delay section 112, timing at which a RF phase modulation signal is input to power amplifier 114 in amplitude modulation section 115b from VCO 101 in phase modulation section 110, and timing at which a BB amplitude modulation signal is input to power amplifier 114 from power supply section 113 in amplitude modulation section 115b are suitably controlled However, the inventor of the invention thought that adopting the configuration as shown in FIG. 2 results in a problem that it takes a time to make a timing adjustment (synchronization adjustment) to the RF phase modulation signal and BB amplitude modulation signal. This problem will be described below with reference to FIG. 3.

Figure 3:
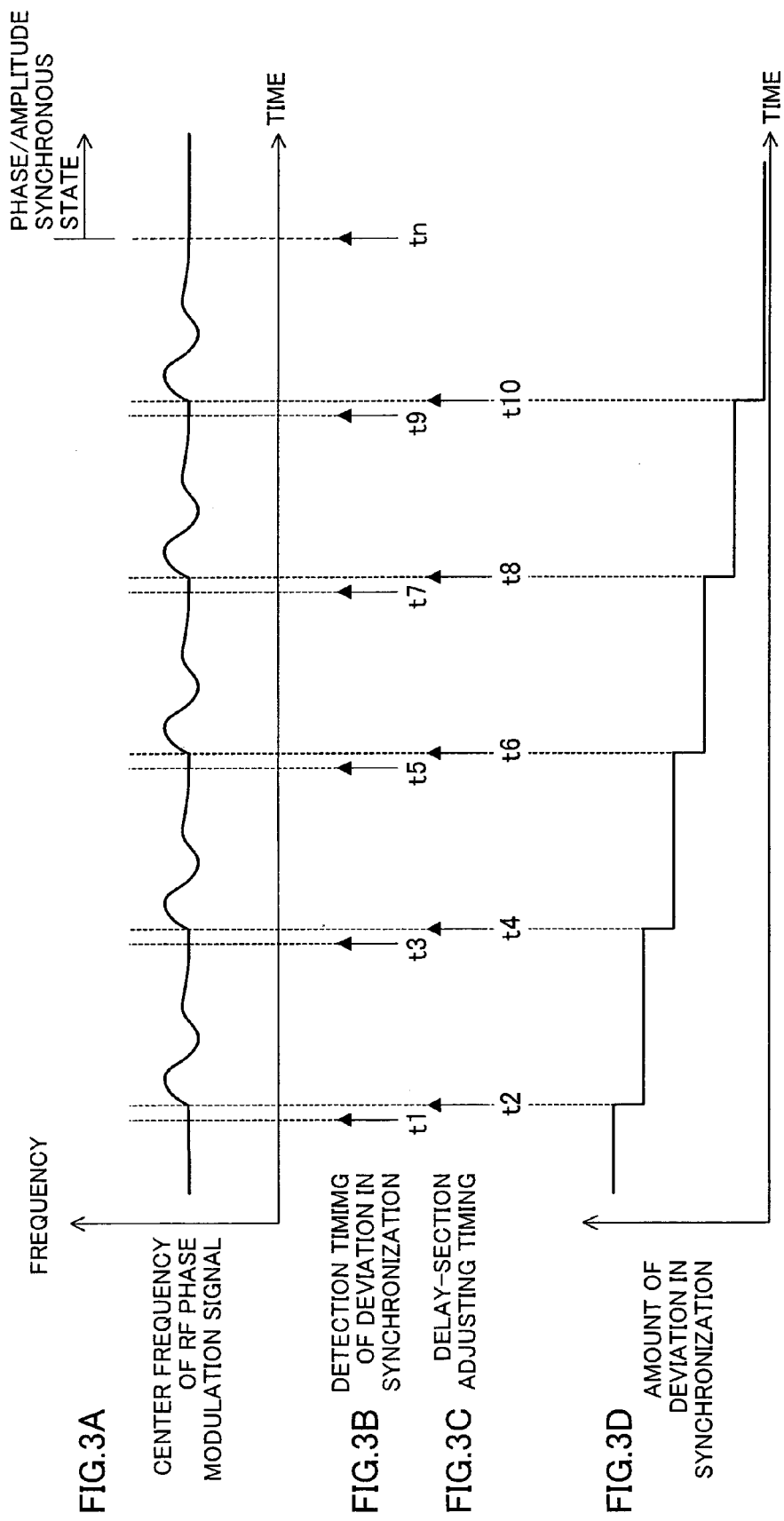
FIG. 3 contains a timing chart until synchronization between the RF phase modulation signal and BB amplitude modulation signal is acquired in the transmission modulation apparatus as shown in FIG. 2, where

FIG. 3 is a timing chart showing until synchronization between the RF phase modulation signal output from VCO 101 in phase modulation section 110 and BB amplitude modulation signal output from power supply control section 113 in amplitude modulation section 115b is acquired in the transmission modulation apparatus as shown in FIG. 2. The example of FIG. 3 illustrates the operation of delay amount control when the delay amount in first delay section 105 is changed. At time t1 of timing for detecting a deviation in synchronization between the RF phase modulation signal and BB amplitude modulation signal, control section 116 detects the deviation in synchronization between the RF phase modulation signal and BB amplitude modulation signal. Then, at time t2 of delay-section adjusting timing, control section 116 outputs a control signal to first delay section 105 and controls the delay amount of the BB phase modulation signal. Further, at time t3 of timing for detecting the deviation in synchronization, control section 116 detects the deviation in synchronization between the RF phase modulation signal and BB amplitude modulation signal, and at time t4 of delay-section adjusting timing, control section 116 controls the delay amount of the BB phase modulation signal. By thus repeating detection of deviation in synchronization and control of delay amount of the BB phase modulation signal, the amount of deviation in synchronization decreases gradually, and at time tn, synchronization can be acquired between the FR phase modulation signal and BB amplitude modulation signal.

In addition, when control section 116 outputs a control signal to second delay section 112 to control a delay amount of BB amplitude modulation signal, it is also possible to acquire synchronization between the RF phase modulation signal and BB amplitude modulation signal as in the foregoing.

As expressed in above-mentioned equation (1), since transfer characteristics of the PLL circuit do not affect a BB phase modulation signal ideally in the case of two-point modulation PLL circuit, delaying the BB phase modulation signal does not cause a transient response such that the center frequency of the RF phase modulation signal changes.

However, in the actual state, in the transmission modulation apparatus as shown in FIG. 2, a time difference arises between arrival of the BB phase modulation signal at A point and B point after the BB phase modulation signal is input to phase modulation section 110, and the operation of two-point modulation PLL circuit does not become an ideal state. The time difference between arrival of the BB phase modulation signal at A point and B point can be corrected to some extent at the time of designing. However, since analog circuits such as D/A converter 107 and filter 108 exist, it is not possible to correct the time lag completely due to factors such as fluctuations in manufacturing and variations with temperature of D/A converter 107, filter 108 and the like. Therefore, when the delay amount of first delay section 105 is varied at time t2 of delay-section adjusting timing as shown in FIG. 3, a transient response of the PLL circuit occurs from this point, and the center frequency of the RF phase modulation signal is varied.

Consequently, for example, since next detection of deviation in synchronization is performed only after delay adjustment is performed at time t2 and the variation in center frequency of the RF phase modulation signal converges, after a relatively long time passes, the deviation in synchronization is detected at time t3, and then, the delay amount of the BB phase modulation signal is controlled at time t4 of delay-section adjusting timing. Since the operation is thus repeated such that next delay amount control is performed after the variation in center frequency of the RF phase modulation signal converges, relatively long time is required until time tn at which synchronization is acquired. For example, in FIG. 3, after detection of deviation in synchronization and delay amount control is repeated in five times through relatively long convergence time of transient response for each cycle, synchronization is first acquired at time tn. Since relatively long time is thus taken to acquire synchronization, it is necessary to start the transmission modulation apparatus earlier by the time, and as a result, the communication time is shortened when the transmission modulation apparatus is installed in a mobile wireless apparatus.

With such consideration, the inventor of the invention reached the present invention. In the present invention, a transmission modulation apparatus that performs polar modulation by two-point modulation scheme has a configuration where, for example, a switch is provided in a loop of a PLL circuit. Then, when the deviation in synchronization is corrected between the RF phase modulation signal and BB amplitude modulation signal, the switch is OFF to make the PLL circuit open loop. Such an open loop is provided in order to prevent a transient response from occurring in a signal passed through the PLL circuit at timing of adjusting a delay amount of the BB phase modulation signal and the center frequency of the RF phase modulation signal from changing. It is thereby possible to acquire synchronization between the RF phase modulation signal and BB amplitude modulation signal in a short time.

Preferred Embodiments of the transmission modulation apparatus of the invention will specifically be described below with reference to accompanying drawings. In addition, the same structural elements are assigned the same reference numerals in figures used for each of the Embodiments to omit redundant descriptions as possible.

Embodiment 1

Figure 4:
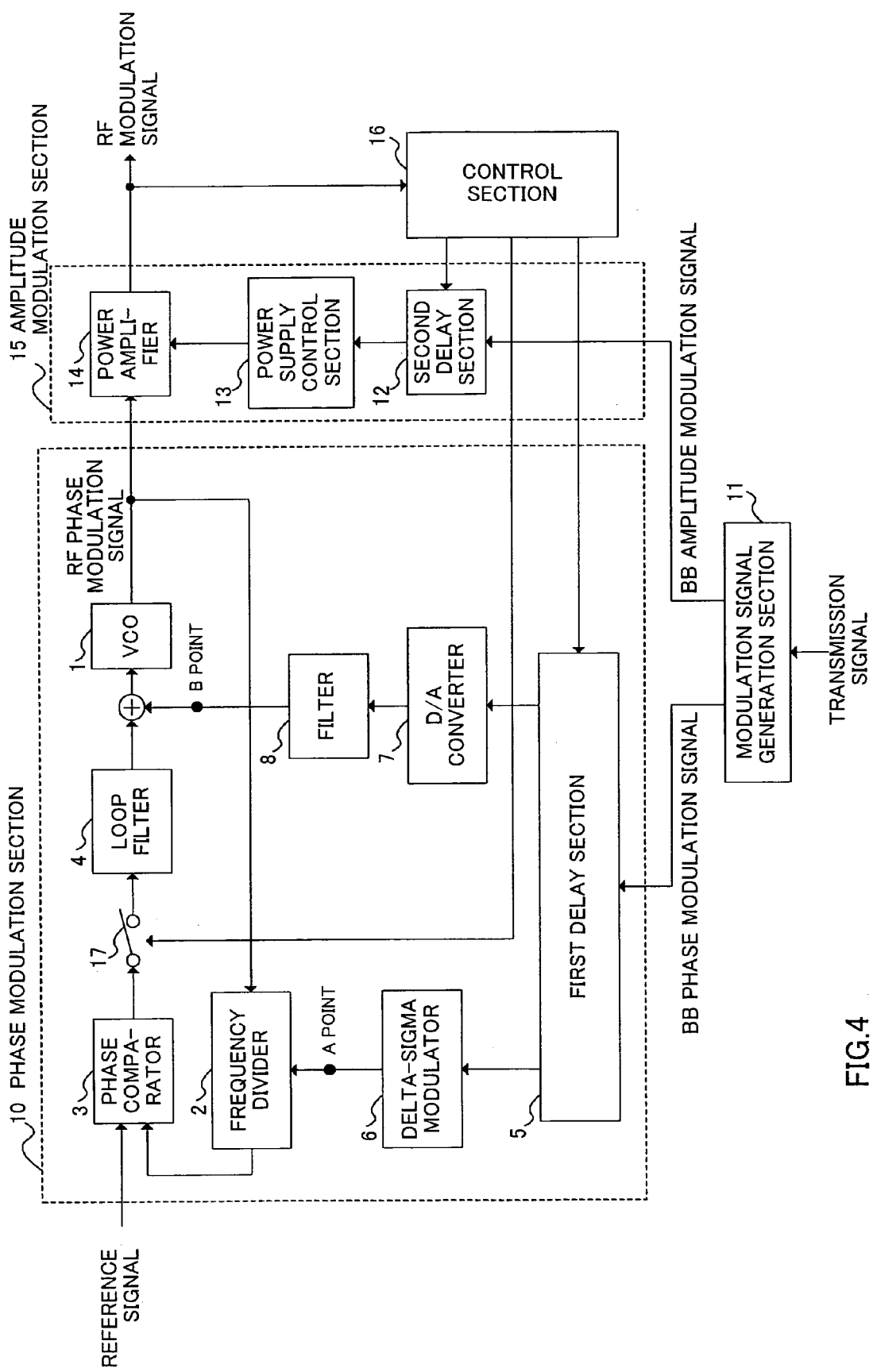
FIG. 4 is a block diagram illustrating a configuration of a transmission modulation apparatus according to Embodiment 1 of the present invention.

FIG. 4 is a block diagram illustrating a configuration of a transmission modulation apparatus in Embodiment 1 of the invention. The transmission modulation apparatus in Embodiment 1 of the invention as shown in FIG. 4 differs from the transmission modulation apparatus as shown in FIG. 2 in that switch (high-impedance section) 17 comprised of a semiconductor switch is provided between phase comparator 3 and loop filter 4 in phase modulation section 10, and that control section 16 outputs a control signal to switch 17. By this means, when a synchronization adjustment of a RF phase modulation signal and BB amplitude modulation signal is performed, switch 17 is turned off to make the PLL circuit open loop, so that a transient response does not occur in a signal passed through the PLL circuit at timing for adjusting a delay amount of the BB phase modulation signal, thereby enabling synchronization between the RF phase modulation signal and BB amplitude modulation signal to be acquired in a short time.

In other words, the transmission modulation apparatus as shown in FIG. 4 is comprised of phase modulation section 10 that performs phase modulation based on a reference signal and BB phase modulation signal and generates a RF phase modulation signal, modulation signal generation section 11 that separates a transmission signal into a BB (baseband) phase modulation signal and BB amplitude modulation signal and outputs them, amplitude modulation section 15 which performs amplitude modulation on the input RF phase modulation signal, generates a desired RF modulation signal and output the signal, and control section 16 that outputs a control signal to control delay amounts of the BB phase modulation signal and BB amplitude modulation signal.

According to this configuration, a transmission signal input to modulation signal generation section 11 is separated into a BB phase modulation signal and BB amplitude modulation signal, and the BB phase modulation signal output from modulation signal generation section 11 is input to phase modulation 10, while the BB amplitude modulation signal output from modulation signal generation section 11 is input to amplitude modulation section 15. At this point, based on the input BB phase modulation signal, phase modulation section 10 performs phase modulation on a signal with a carrier frequency and outputs a RF phase modulation signal to amplitude modulation section 15. Based on the input BB amplitude modulation signal, amplitude modulation section 15 performs amplitude modulation on the RF phase modulation signal input from phase modulation section 10 and outputs a desired RF modulation signal. Further, delay amounts of the BB phase modulation signal and BB amplitude modulation signal are controlled, using control signals input to phase modulation section 10 and amplitude modulation section 15 from control section 16, respectively.

Phase modulation section 10 has a configuration of a PLL circuit of two-point modulation scheme to implement wideband phase modulation. In other words, phase modulation section 10 employs a configuration having a PLL circuit comprised of VCO 1 that varies the oscillation frequency corresponding to the voltage of a control voltage terminal, frequency divider 2 that divides the frequency of a RF phase modulation signal output from VCO 1, phase comparator 3 that compares in phase between an output signal of frequency divider 2 and a reference signal and outputs a signal corresponding to a phase difference, switch 17 to make the PLL circuit open loop in making a timing adjustment to the BB phase modulation signal and BB amplitude modulation signal, and loop filter 4 that averages output signals of phase comparator 3, first delay section 5 that delays the BB phase modulation signal input from modulation signal generation section 11 to output to delta-signal modulator 6 and D/A converter 5, delta-sigma modulator 6 that performs delta-sigma modulation on the delayed BB phase modulation signal to output a dividing ratio to frequency divider 2, D/A converter 7 that converts the delayed BB phase modulation signal into an analog voltage, and filter 8 which suppresses a high-frequency component occurring in D/A converter 7 and outputs a signal to the control voltage terminal of VCO 1. Amplitude modulation section 15 employs a configuration having second delay section 12 that delays the BB amplitude modulation signal input from modulation signal generation section 11 and outputs the signal to power supply control section 13 based on a control signal from control section 16, power supply control section 13 that multiplexes the BB amplitude modulation signal on a power supply terminal of power amplifier 14, and power amplifier 14 that generates the RF modulation signal including an envelop variation from the BB amplitude modulation signal from power supply control section 13 and RF phase modulation signal from phase modulation section 10.

The operation of the transmission modulation apparatus as shown in FIG. 4 will be described below. The process in which the transmission modulation apparatus generates a wideband stable RF modulation signal by high-efficient and linear polar modulation is of well-known technique as described in Related Art, and descriptions thereof are omitted as possible. Accordingly, in the following descriptions of the operation of the transmission modulation apparatus, the operation will be described specifically for completing a timing adjustment of the BB phase modulation signal and BB amplitude modulation signal in a short time in the transmission modulation apparatus that performs polar modulation in two-point modulation.

The operation in the transmission modulation apparatus as shown in FIG. 4 will briefly be described first. Phase modulation section 10 performs phase modulation on a BB phase modulation signal and generates a RF phase modulation signal. Amplitude modulation section 15 combines the RF phase modulation signal and BB amplitude modulation signal, performs polar modulation, generates a RF modulation signal and transmits the signal. At this point, phase modulation section 10 performs two-point modulation in the PLL circuit comprised of VCO 1, frequency divider 2, phase comparator 3 and loop filter 4. Ordinary synchronization adjustments of the BB phase modulation signal and BB amplitude modulation signals are made by correcting a delay amount in first delay section 5 or second delay section 12.

Here, as synchronization adjustments performed by the transmission modulation apparatus, there are two synchronization adjustments, i.e. adjustment of synchronization between A point and B point, and an adjustment of synchronization between the RF modulation signal and BB amplitude modulation signal. A specific example of the operation is first described on the order in which the synchronization adjustments are made. First delay section 5 is designed to adjust timing to decrease a time difference between arrival at A point and B point of a BB phase modulation signal after the BB phase modulation signal is input to phase modulation section 10, and then outputs the BB phase modulation signal to delta-sigma modulator 6 and D/A converter 7.

Actually, the path to B point includes analog circuits such as filter 8, and the propagation delay time thereby varies due to fluctuations in manufacturing and the like. Delta-sigma modulator 6 on the path to A point is a digital circuit, and the propagation delay time does not vary on the path. Therefore, in order to decrease a time difference between arrival at A point and B point of the BB phase modulation signal, first delay section 5 makes a timing adjustment.

When the propagation delay time of the analog circuits is shorter than that of when designed, first delay section 5 makes a timing adjustment to delay the time for the BB phase modulation signal to arrive at B point. Contrary, when the propagation delay time of the analog circuits is longer than that of when designed, first delay section 5 makes a timing adjustment to delay the time for the BB phase modulation signal to arrive at A point.

Next, after making the PLL circuit open loop, first delay section 5 corrects a delay amount of the BB phase modulation signal and makes a synchronization adjustment of the phase modulation signal and amplitude modulation signal. At this point, the previously adjusted time difference is maintained between arrival of the BB phase modulation signal at A point and B point. In other words, the A-point side is delayed by a delay on the B-point side in open-loop state. This is because it is necessary to decrease the time difference between arrival of the BB phase modulation signal at A point and B point when the PLL circuit is back to closed loop.

Referring to FIGS. 5A to 5E, the operation will specifically be described below of correcting the deviation in synchronization between the RF phase modulation signal and BB amplitude modulation signal in the open loop. FIG. 5 contains a timing chart until synchronization between the RF phase modulation signal and BB amplitude modulation signal is acquired in the transmission modulation apparatus as shown in FIG. 4. Accordingly, referring to FIGS. 4 and 5, the operation will be described for acquiring synchronization between the RF phase modulation signal and BB amplitude modulation signal. When timing adjustments of the BB phase modulation signal and BB amplitude modulation signal output from modulation signal generation section 11 are made, first, at time t0, switch 17 comprised of a semiconductor switch is turned off with a control signal from control section 16 and causes the open loop in the PLL circuit comprised of VCO 1, frequency divider 2, phase comparator 3 and loop filter 4. At this point, loop filter 4 maintains the charge when switch 17 is turned off, the control voltage of VCO 1 is thus reserved, and therefore, the center frequency of VCO 1 is held stably after time t0.

From this point (i.e. from time t0), VCO 1 outputs a RF phase modulation signal based on a BB phase modulation signal output from filter 8 in phase modulation section 10, and power amplifier 14 in amplitude modulation section 15 outputs a signal (RF modulation signal) obtained by performing phase modulation on the RF phase modulation signal. As in the case of FIG. 3 previously described, at time t1, control section 16 detects the deviation in synchronization between the RF phase modulation signal and BB amplitude modulation signal, and based on the detection result, at time t2, controls a delay amount of the BB phase modulation signal in first delay section 5.

At this point (i.e. at time t2), since the PLL circuit is in open-loop state, even when the delay amount of the BB phase modulation signal varies in first delay section 5, a variation does not occur in the center frequency of the RF phase modulation signal output from VCO 1. Further, a response until the RF phase modulation signal is output to an output terminal from the control voltage terminal of VCO 1 is extremely high speed, and it is thus possible to perform next detection of deviation in synchronization at time t3 immediately after first delay section 5 adjusts the delay amount of the BB phase modulation signal. Thus, after repeating detection of deviation in synchronization at a plurality of times, t3, t5, t7 and t9 and delay adjustment at times t4, t6, t8 and t10 immediately after respective detection of deviation in synchronization, detection of deviation in synchronization is performed at time t11, and when the RF phase modulation signal and BB amplitude modulation signal are synchronous, switch 17 is closed and the PLL circuit is made to the original closed loop at time t12.

In other words, the center frequency of the RF phase modulation signal does not vary for a period during which the PLL circuit is open loop, it is possible to repeat detection of deviation in synchronization at a plurality of times, t3, t5, t7, t9 and t11 and delay adjustment at times t4, t6, t8 and t10 immediately after respective detection of deviation in synchronization in timing steps in a short time. Accordingly, as a result, it is possible to achieve synchronization between the RF phase modulation signal and BB amplitude modulation signal in a short time.

In addition, from the time (time t12) when synchronization between the RF phase modulation signal and BB amplitude modulation signal is achieved and switch 17 is turned on to the time when PLL circuit is locked, a variation in the center frequency transiently occurs in the RF phase modulation signal. Accordingly, at the time (time t13) when the variation converges, the timing adjustment is completed to the BB phase modulation signal and BB amplitude modulation signal. However, the variation in the center frequency of the RF phase modulation signal is not repeated over a plurality of times, and it is thereby possible to achieve synchronization between the RF phase modulation signal and BB amplitude modulation signal relatively in a short time.

Switch 17 is provided between phase comparator 3 and loop filter 4 in FIG. 4, but is not limited to this position. In other words, switch 17 may be provided at any positions as long as it is in position enabling the control voltage of VCO 1 to be reserved during the synchronization adjustment of the BB phase modulation signal and BB amplitude modulation signal when switch 17 is turned off and causes the PLL circuit to be open loop. For example, the switch may be provided in loop filter 4. In this case, when the switch is provided at least upstream from a largest-capacitance capacitor among capacitors constituting loop filter 4, it is possible to reserve the control voltage of VCO 1 in open-loop state.

Figure 6:
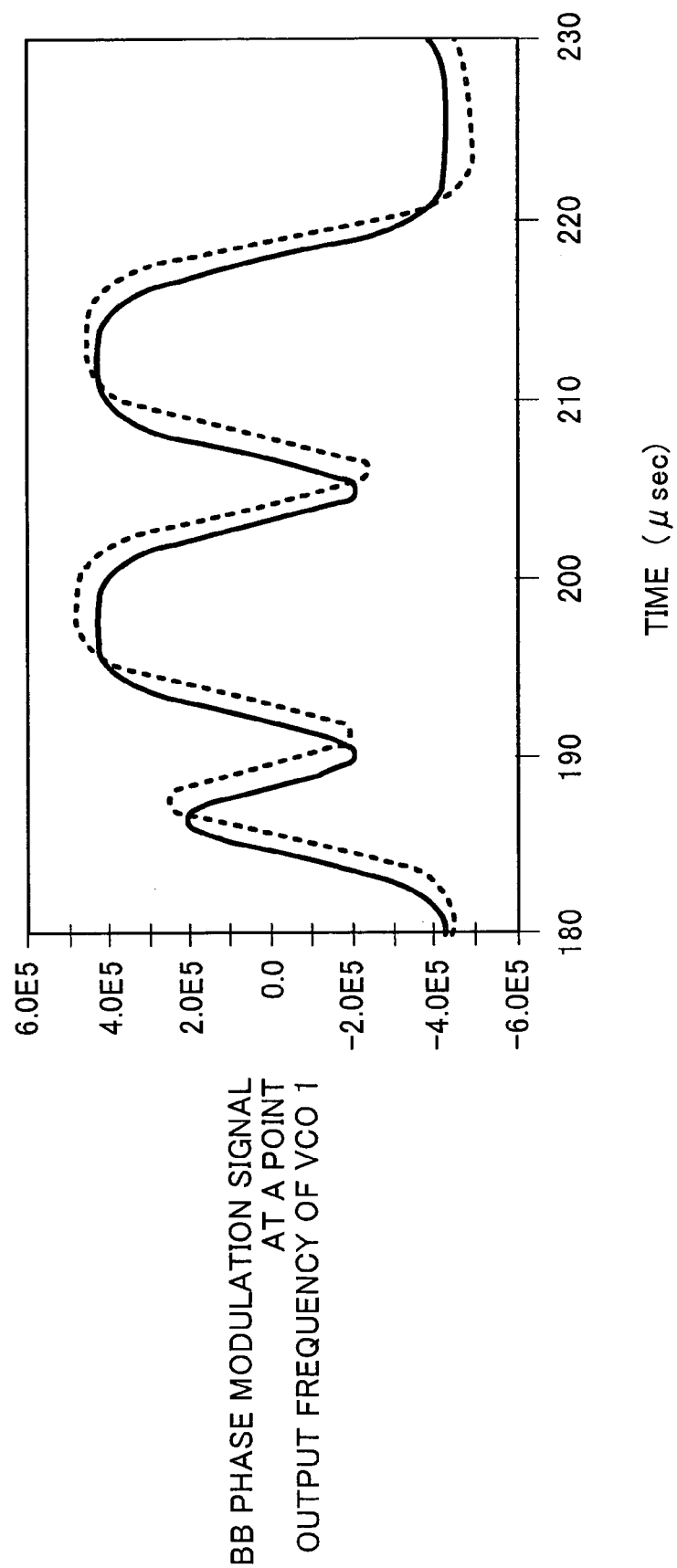
FIG. 6 is a graph showing a result of simulation of the RF phase modulation signal in the transmission modulation apparatus as shown in FIG. 4.

FIG. 6 is a graph showing a result of simulation of the RF phase modulation signal in the transmission modulation apparatus as shown in FIG. 4. In other words, FIG. 6 shows a result of simulating the variation of the center frequency appearing in an output of VCO 1 when, in FIG. 4, with switch 17 of phase modulation section 10 being closed, a time difference between BB phase modulation signals at A point and B point is assumed to be 1 μsec and a BB phase modulation signal delayed by 1 μsec with respect to A point is provided to B point.

In FIG. 6, the horizontal axis represents a lapse of time, and the vertical axis represents the level of the BB phase modulation signal at A point and a BB phase modulation signal component in the RF phase modulation signal in an output of VCO 1. In FIG. 6, the solid line represents the BB phase modulation signal input to A point, while the dashed line represents the BB phase modulation signal component in the RF phase modulation signal in an output of VCO 1. In this way, the frequency of the RF phase modulation signal in an output of VCO 1 responds to the BB phase modulation signal input to A point by a delay of about 1 μsec. This is because that a BB phase modulation signal delayed by 1 μsec relative to A point is input to B point. In other words, by checking the BB phase modulation signal at B point, it is possible to recognize the delay time of the RF phase modulation signal output from VCO 1.

When a time difference occurs between BB phase modulation signals at A point and B point due to fluctuations in manufacturing and variations with temperature of analog circuits such as D/A converter 7 and filter 8 in phase modulation circuit 10 as shown in FIG. 4 and the like, it may be considered that the signal timing of the BB phase modulation signal at B point conform with the signal timing of the RF phase modulation signal. In other words, even when the delay amount of the BB phase modulation signal at the B-point side is varied in the PLL circuit of open loop with switch 17 being off and synchronization is completed between the RF phase modulation signal and BB amplitude modulation signal, synchronization between the RF phase modulation signal and BB amplitude modulation signal does not deteriorate after switch 17 is turned on and the PLL circuit is back to closed loop. In this way, a transient response does not occur in the PLL circuit even when the delay amount of the BB phase modulation signal is adjusted, and it is thereby possible to complete the timing adjustment of the BB phase modulation signal and BB amplitude modulation signal in a short time.

Embodiment 2

Figure 7:
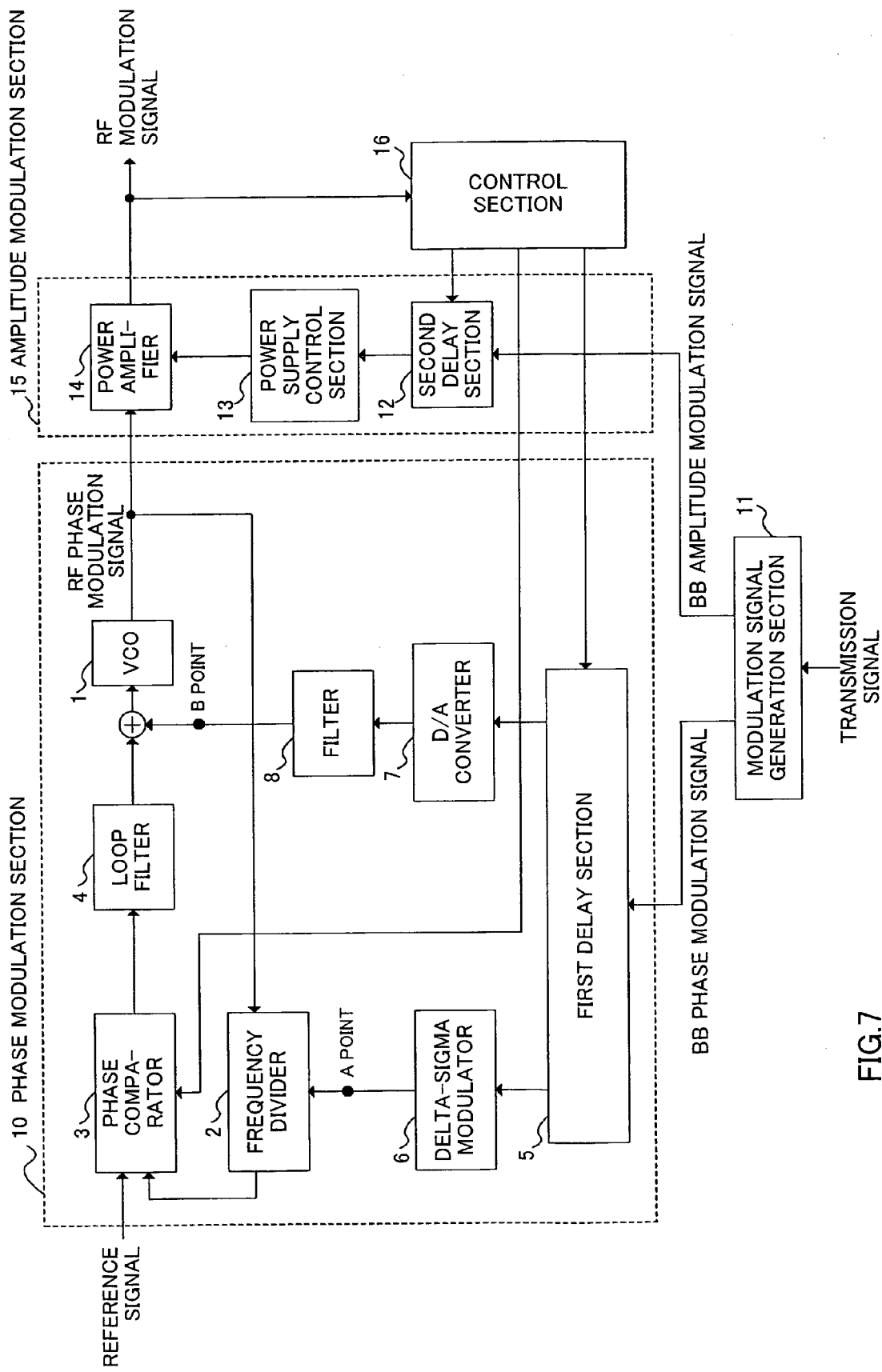
FIG. 7 is a block diagram illustrating a configuration of a transmission modulation apparatus according to Embodiment 2 of the invention.

FIG. 7 is a block diagram illustrating a configuration of a transmission modulation apparatus in Embodiment 2 of the invention. The transmission modulation apparatus of FIG. 8 differs from the transmission modulation apparatus of FIG. 4 in that switch 17 is removed, phase comparator 3 and loop filter 4 are directly connected making the PLL circuit closed loop, and that control section 16 outputs a control signal to phase comparator 3.

In other words, in the transmission modulation apparatus of Embodiment 1 as shown in FIG. 4, the PLL circuit is made close-loop state using switch 17. In the transmission modulation apparatus of Embodiment 2 as shown in FIG. 7, switch 17 is not provided, and when a synchronization adjustment to the RF phase modulation signal and BB amplitude modulation signal is made, an output side of phase comparator 3 is made high-impedance state with a control signal from control section 16. It is thereby possible to make the close-loop state of the PLL circuit, and complete the timing adjustment to the BB phase modulation signal and BB amplitude modulation signal in a short time as in Embodiment 1 as described previously.

Embodiment 3

Figure 8:
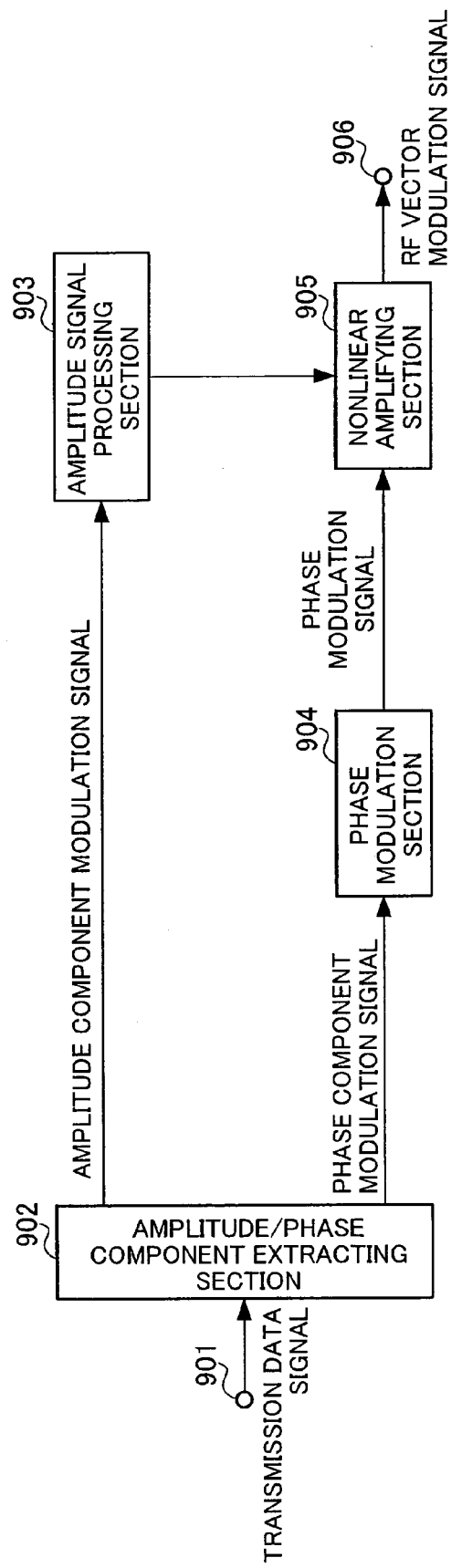
FIG. 8 is a block diagram showing an example of a configuration of a communication apparatus provided with the transmission modulation apparatus of the invention.

The present invention is applicable to a configuration in which the transmission modulation apparatus as described in each of the above-mentioned Embodiments is installed in a communication apparatus or a mobile wireless apparatus (such as, for example, a cellular telephone). FIG. 8 is a block diagram showing an example of a configuration of a communication apparatus provided with the transmission modulation apparatus of the invention. The communication apparatus has a configuration provided with transmission data signal input terminal 901, amplitude/phase component extracting section 902, amplitude signal processing section 903, phase modulation section 904, nonlinear amplifying section 905, and transmission output terminal 906. The transmission modulation apparatus of the invention as described above is comprised of a combination of above-mentioned elements, where amplitude/phase component extracting section 902 corresponds to modulation signal generation section 11, amplitude signal processing section 903 corresponds to second delay section 12 and power supply control section 13, phase modulation section 904 corresponds to phase modulation section 10, and nonlinear amplifying section 905 corresponds to power amplifier 14.

When a transmission data signal is input through transmission data signal input terminal 901, amplitude/phase component extracting section 902 extracts an amplitude component modulation signal and phase component modulation signal from the transmission data signal. Then, a power supply voltage value of nonlinear amplifying section 905 is set by the amplitude component modulation signal through amplitude signal processing section 903. Further, phase modulation section 904 generates a phase modulation signal obtained by performing phase modulation on a carrier with an angular frequency with the phase component modulation signal to input to nonlinear amplifying section 905.

Then, nonlinear amplifying section 905 outputs a RF vector modulation signal (RF modulation signal) obtained by multiplying the power supply voltage value of nonlinear amplifying section 905 by a phase modulation signal that is an output signal of phase modulation section 904 and amplifying the resultant signal by gain G of nonlinear amplifying section 905. At this point, the modulation signal input to nonlinear amplifying section 905 is a phase modulation signal that is a modulation signal with a constant envelop level, and it is thus possible to use the nonlinear amplifier with efficiency as a high-frequency amplifier. In this way, it is possible to apply the transmission modulation apparatus as described in each of the above-mentioned Embodiments to a configuration installed on the communication apparatus and mobile wireless apparatus. By this means, it is possible to increase the communication time of a communication apparatus and mobile wireless apparatus.

As described in Embodiments 1 to 3 in the foregoing, an aspect of the transmission modulation apparatus of the invention is a transmission modulation apparatus that performs polar modulation by combining a RF phase modulation signal generated by performing two-point modulation using a PLL circuit and an amplitude modulation signal and transmits a modulation signal, and adopts a configuration provided with a delay section that adjusts timing for inputting a baseband phase modulation signal to the PLL circuit, and a high-impedance section that makes the PLL circuit equivalently open loop.

Further, another aspect of the transmission modulation apparatus of the invention is a transmission modulation apparatus provided with a phase modulation section that generates a RF phase modulation signal based on a baseband phase modulation signal extracted from a transmission signal, and an amplitude modulation section which combines the RF phase modulation signal and a baseband amplitude modulation signal extracted from the transmission signal, thereby performs polar modulation, and transmits a modulation signal, and adopts a configuration where the phase modulation section has a PLL circuit that performs two-point modulation based on the baseband phase modulation signal and generates the RF phase modulation signal, a delay section that adjusts timing for inputting the baseband phase modulation signal to the PLL circuit, and a high-impedance section that makes a loop of the PLL circuit equivalently open loop.

According to these configurations, it is possible to implement correction of deviation in synchronization between the baseband amplitude modulation signal and RF phase modulation signal by the delay section correcting a delay amount of the baseband phase signal. Further, since the high-impedance section is provided that makes the loop of the PLL circuit equivalently open loop, only when the delay section acquires synchronization between the baseband amplitude modulation signal and RF phase modulation signal, it is possible to make the loop of the PLL circuit equivalently open loop by operating the high-impedance section. By this means, the center frequency of the RF phase modulation signal does not shift when the PLL circuit is open loop, and it is thus possible to correct the delay amount of the phase modulation signal in an extremely short time and acquire synchronization between the baseband amplitude modulation signal and RF phase modulation signal. In other words, when the delay section makes a delay adjustment to the baseband phase modulation signal with the PLL circuit being kept closed loop, the center frequency of the RF phase modulation signal varies every time when adjustment is made, which result in taking a long time to converge the deviation in synchronization between the baseband amplitude modulation signal and RF phase modulation signal. According to the above-mentioned configuration, however, it is possible to avoid such an event effectively.

Further, another aspect of the transmission modulation apparatus of the invention adopts a configuration where the high-impedance section is a switch, and the switch is disposed at a position that enables the control voltage of a voltage control oscillator constituting the PLL circuit to be reserved even when the switch is turned off. According to such a configuration, using a switch as the high-impedance section enables the transmission modulation apparatus of the invention to be implemented with ease. In this case, the switch is disposed in a position, inside the loop of the PLL circuit, which enables the control voltage of the voltage control oscillator to be reserved even when the switch is turned off. Accordingly, even when the switch is turned off and the synchronization adjustment is made to the baseband amplitude modulation signal and RF phase modulation signal, the control voltage of the voltage control oscillator is reserved, and therefore, the center frequency of the RF phase modulation signal does not shift. It is thereby possible to complete an adjustment of synchronization between the baseband amplitude modulation signal and RF phase modulation signal in a short time only by operating the switch, and thus implement the transmission modulation apparatus with extremely high operability.

Further, another aspect of the transmission modulation apparatus of the invention adopts a configuration where the switch is disposed between the phase comparator and loop filter constituting the PLL circuit.

According to such a configuration, since the switch is disposed in a stable position that enables the easiest attachment in the loop of the PLL circuit, the operability is further improved in adjustment of synchronization between the baseband amplitude modulation signal and RF phase modulation signal in the transmission modulation apparatus.

Further, another aspect of the transmission modulation apparatus of the invention adopts a configuration where the high-impedance section has the function of making an output signal of the phase comparator constituting the PLL circuit high impedance and thereby making the loop of the PLL circuit equivalently open loop.

According to such a configuration, even when the switch is not provided inside the loop of the PLL circuit, an output signal of the phase comparator is made high impedance with a control signal from outside, and it is thereby possible to make the PLL circuit equivalently open loop. Accordingly, it is possible to make a synchronization adjustment of the baseband amplitude modulation signal and RF phase modulation signal using the already-existing transmission modulation apparatus without adding a component such as a switch or the like.

Further, another aspect of the transmission modulation apparatus of the invention adopts a configuration where the amplitude modulation section is provided with a second delay section that delays the baseband amplitude modulation signal relative to the baseband phase modulation signal.

According to such a configuration, even when the timing of the baseband amplitude modulation signal is faster than the timing of a corresponding RF phase modulation signal, it is possible to make a synchronization adjustment in the second delay adjustment section by delaying the baseband amplitude modulation signal.

Further, the present invention is capable of implementing a communication apparatus and a mobile wireless apparatus installed with any one of the above-mentioned transmission modulation apparatuses.

According to such a configuration, it is possible to correct the deviation in synchronization between the baseband phase modulation signal and baseband amplitude modulation signal in the transmission modulation apparatus in a short time, and thereby increase the communication time of the a communication apparatus and a mobile wireless apparatus.

The present invention is not limited to the above described Embodiments, and various variations and modifications may be possible without departing from the scope of the present invention.

This application is based on the Japanese Patent Application No. 2005-036089 filed on Feb. 14, 2005, the entire content of which is expressly incorporated by reference herein.

What is claimed is:

1. A transmission modulation apparatus which performs polar modulation by combining a RF phase modulation signal generated by performing two-point modulation using a PLL circuit and an amplitude modulation signal and transmits a modulation signal, the transmission modulation apparatus comprising:
a delay section that adjusts timing for inputting a baseband phase modulation signal to the PLL circuit; and
a high-impedance section that makes the PLL circuit equivalently open loop.

2. A transmission modulation apparatus provided with a phase modulation section that generates a RF phase modulation signal based on a baseband phase modulation signal extracted from a transmission signal, and an amplitude modulation section that combines the RF phase modulation signal and a baseband amplitude modulation signal extracted from the transmission signal, thereby performs polar modulation, and transmits a modulation signal,
wherein the phase modulation section has a PLL circuit that performs two-point modulation based on the baseband phase modulation signal and generates the RF phase modulation signal;
a delay section that adjusts timing for inputting the baseband phase modulation signal to the PLL circuit; and
a high-impedance section that makes a loop of the PLL circuit equivalently open loop.

3. The transmission modulation apparatus according to claim 2, wherein the high-impedance section is a switch, and the switch is disposed at a position that enables a control voltage of a voltage control oscillator constituting the PLL circuit to be reserved even when the switch is turned off.

4. The transmission modulation apparatus according to claim 3, wherein the switch is disposed between a phase comparator and a loop filter constituting the PLL circuit.

5. The transmission modulation apparatus according to claim 2, wherein the high-impedance section has a function of making an output signal of a phase comparator constituting the PLL circuit high impedance and thereby making the loop of the PLL circuit equivalently open loop.

6. The transmission modulation apparatus according to claim 2, wherein the amplitude modulation section further has a second delay section that delays the baseband amplitude modulation signal relative to the baseband phase modulation signal.

7. A communication apparatus provided with the transmission modulation apparatus according to claim 1.

8. A mobile wireless apparatus provided with the transmission modulation apparatus according to claim 1.

* * * * *